United States Patent
Lee et al.

(10) Patent No.: US 7,006,019 B2
(45) Date of Patent: Feb. 28, 2006

(54) RATE-7/8 MAXIMUM TRANSITION RUN CODE ENCODING AND DECODING METHOD AND APPARATUS

(75) Inventors: Jun Lee, Yongin-si (KR); Joo-hyun Lee, Seoul (KR); Jae-jin Lee, Seoul (KR); Byung-kyu Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 115 days.

(21) Appl. No.: 10/973,831

(22) Filed: Oct. 27, 2004

(65) Prior Publication Data

US 2005/0116843 A1    Jun. 2, 2005

(30) Foreign Application Priority Data

Oct. 27, 2003    (KR) ........................ 10-2003-0075227

(51) Int. Cl.
*H03M 7/00*    (2006.01)

(52) U.S. Cl. ............................. 341/59; 341/50; 341/58

(58) Field of Classification Search .................. 341/50, 341/58, 59
See application file for complete search history.

(56) References Cited

U.S. PATENT DOCUMENTS

| | | | | |
|---|---|---|---|---|
| 4,760,378 A | * | 7/1988 | Iketani et al. ................. | 341/59 |
| 6,032,284 A | * | 2/2000 | Bliss ............................ | 341/59 |
| 6,032,287 A | * | 3/2000 | Kallas .............................. | 2/69 |
| 6,400,288 B1 | * | 6/2002 | Fredrickson et al. .......... | 341/59 |
| 6,476,737 B1 | * | 11/2002 | Caroselli et al. .............. | 341/59 |

* cited by examiner

*Primary Examiner*—Lam T. Mai
(74) *Attorney, Agent, or Firm*—Sughrue Mion, PLLC

(57) ABSTRACT

A rate 7/8 MTR code encoding/decoding method and apparatus. The encoding method includes: generating a rate-7/8 MTR code for inputting 7-bit data and outputting a predetermined 8-bit codeword; checking whether codewords satisfy a predetermined constraint condition by connecting the 8-bit codeword and a subsequent 8-bit codeword; and if the codewords do not violate the constraint condition, not converting the codewords. The decoding method includes: checking whether the codewords satisfy a predetermined MTR constraint condition by connecting a current 8-bit codeword c(k) and a subsequent 8-bit codeword c(k+1); if the codewords violate the constraint condition, converting the codewords, and if the codewords do not violate the constraint condition, not converting the codewords; and decoding each converted 8-bit codeword into 7-bit data using a predetermined MTR code. Data is reliably reproduced with high write density, and large amounts of data are stored in and reproduced from a magnetic recording information storage medium.

14 Claims, 7 Drawing Sheets

FIG. 2

| Source | Codeword | Source | Codeword | Source | Codeword | Source | Codeword |
|--------|----------|--------|----------|--------|----------|--------|----------|
| 0000000 | 00000010 | 0100000 | 00110101 | 1000000 | 10000010 | 1100000 | 10110101 |
| 0000001 | 00000100 | 0100001 | 00110110 | 1000001 | 10000100 | 1100001 | 10110110 |
| 0000010 | 00000101 | 0100010 | 01000001 | 1000010 | 10000101 | 1100010 | 00000011 |
| 0000011 | 00000110 | 0100011 | 01000010 | 1000011 | 10000110 | 1100011 | 00001011 |
| 0000100 | 00001000 | 0100100 | 01000100 | 1000100 | 10001000 | 1100100 | 00010011 |
| 0000101 | 00001001 | 0100101 | 01000101 | 1000101 | 10001001 | 1100101 | 00100011 |
| 0000110 | 00001010 | 0100110 | 01000110 | 1000110 | 10001010 | 1100110 | 00101011 |
| 0000111 | 00001100 | 0100111 | 01001000 | 1000111 | 10001100 | 1100111 | 00110011 |
| 0001000 | 00001101 | 0101000 | 01001001 | 1001000 | 10001101 | 1101000 | 01000011 |
| 0001001 | 00010000 | 0101001 | 01001010 | 1001001 | 10010000 | 1101001 | 01001011 |
| 0001010 | 00010001 | 0101010 | 01001100 | 1001010 | 10010001 | 1101010 | 01010011 |
| 0001011 | 00010010 | 0101011 | 01001101 | 1001011 | 10010010 | 1101011 | 01100011 |
| 0001100 | 00010100 | 0101100 | 01010000 | 1001100 | 10010100 | 1101100 | 01101011 |
| 0001101 | 00010101 | 0101101 | 01010001 | 1001101 | 10010101 | 1101101 | 10000011 |
| 0001110 | 00010110 | 0101110 | 01010010 | 1001110 | 10010110 | 1101110 | 10001011 |
| 0001111 | 00011000 | 0101111 | 01010100 | 1001111 | 10011000 | 1101111 | 10010011 |
| 0010000 | 00011001 | 0110000 | 01010101 | 1010000 | 10011001 | 1110000 | 10100011 |
| 0010001 | 00011010 | 0110001 | 01010110 | 1010001 | 10011010 | 1110001 | 10101011 |
| 0010010 | 00100001 | 0110010 | 01011000 | 1010010 | 10100001 | 1110010 | 10110011 |
| 0010011 | 00100010 | 0110011 | 01011001 | 1010011 | 10100010 | 1110011 | 11010001 |
| 0010100 | 00100100 | 0110100 | 01011010 | 1010100 | 10100100 | 1110100 | 11010010 |
| 0010101 | 00100101 | 0110101 | 01100001 | 1010101 | 10100101 | 1110101 | 11010011 |
| 0010110 | 00100110 | 0110110 | 01100010 | 1010110 | 10100110 | 1110110 | 11010100 |
| 0010111 | 00101000 | 0110111 | 01100100 | 1010111 | 10101000 | 1110111 | 11010101 |
| 0011000 | 00101001 | 0111000 | 01100101 | 1011000 | 10101001 | 1111000 | 11010110 |
| 0011001 | 00101010 | 0111001 | 01100110 | 1011001 | 10101010 | 1111001 | 11011000 |
| 0011010 | 00101100 | 0111010 | 01101000 | 1011010 | 10101100 | 1111010 | 11011001 |
| 0011011 | 00101101 | 0111011 | 01101001 | 1011011 | 10101101 | 1111011 | 11011010 |
| 0011100 | 00110000 | 0111100 | 01101010 | 1011100 | 10110000 | 1111100 | 00011011 |
| 0011101 | 00110001 | 0111101 | 01101100 | 1011101 | 10110001 | 1111101 | 01011011 |
| 0011110 | 00110010 | 0111110 | 01101101 | 1011110 | 10110010 | 1111110 | 10011011 |
| 0011111 | 00110100 | 0111111 | 10000001 | 1011111 | 10110100 | 1111111 | 11011011 |

(a) j=2

(b) j=3

RATE-7/8 MAXIMUM TRANSITION RUN CODE ENCODING AND DECODING METHOD AND APPARATUS

BACKGROUND OF THE INVENTION

This application claims the priority of Korean Patent Application No. 2003-75227, filed on Oct. 27, 2003, in the Korean Intellectual Property Office, the disclosure of which is incorporated herein in its entirety by reference.

1. Field of the Invention

The present invention relates to coding and signal processing for a high density magnetic recording system, and more particularly, to a maximum transition run (MTR) code encoding and decoding method and apparatus suitable for a high density recording system.

2. Description of the Related Art

Conventional codes include a general modulation code and a relatively low rate maximum transition run (MTR) code. Examples of general modulation codes used for hard disc drives of magnetic recording systems include a rate-8/9 code and a rate-16/17 code. In the rate-8/9 code and the rate-16/17 code, since the number of consecutive data transitions increases and recording density increases, a decrease in data detection performance is caused, and an increase in recording density is limited.

To solve these problems, recent development efforts have focused on MTR coding technologies. In a conventional MTR code, to allow improvement of detection performance in a high density write channel, code technologies where the number of consecutive data transitions is equal to or less than 2 have been developed. However, an increase in a code rate is limited.

An MTR coding technology will be described in brief. A run-length limited (RLL) modulation code is most frequently used in magnetic or optical recording/reproducing systems. In the RLL code, a (d, k) constraint condition allows a generation interval of transition in a modulated non-return-to-zero inversion (NRZI) waveform to be between at least (d+1) bits and at most (k+1) bits by allowing the number of consecutive '0s' between any two '1s' to be between at least d and at most k. The (d, k) code allows inter-symbol interference (ISI) to decrease and simplifies timing recovery.

The MTR code dramatically improves a detection performance as compared with a conventional recording (0, k) code by improving a minimum distance characteristic for recorded data in a high density magnetic recording system. By preventing 3 or more consecutive recording transitions from being generated, 4/5, 5/6, and 6/7 coding technologies have been developed. These codes have relatively high code rates while having detection performance gains similar to a gain of a (1, 7) code. Here, if the maximum number of acceptable transitions (j) is 2, a capacity of the MTR code is obtained according to a k value as shown in Table. 1.

TABLE 1

Capacity of an MTR (j = 2) code

| K | Capacity | k | Capacity |
|---|---|---|---|
| 4 | 0.8376 | 8 | 0.8760 |
| 5 | 0.8579 | 9 | 0.8774 |
| 6 | 0.8680 | 10 | 0.8782 |
| 7 | 0.8732 | ∞ | 0.8791 |

A rate-4/5 MTR coding technology will now be described. In a rate-4/5 MTR code building method, ① codewords including a '111' pattern are removed from all codewords composed of 5 bits, ② by removing codewords including a '11' pattern at a beginning part or an ending part, a condition j=2 can be satisfied when a code sequence is composed, and ③ a codeword '00000' is removed so as not to allow a codeword where k=∞ to be generated.

According to the method, since the number of acceptable codewords is 16, a rate-4/5 code can be built, and the highest acceptable value of k in the code is 8 as shown in Table. 2.

TABLE 2

Rate-4/5 MTR (j = 2; k = 8) code table

| 00001 | 00110 | 01100 | 10010 |
| 00010 | 01000 | 01101 | 10100 |
| 00100 | 10000 | 10000 | 10101 |
| 00101 | 01010 | 10001 | 10110 |

A rate-5/6 MTR code conversion table is shown in Table. 3.

TABLE 3

Conversion table of a rate-5/6 MTR (j = 2; k = 6) code

| "STATE-0" Conversion Table | | "STATE-1" Conversion Table | |
|---|---|---|---|
| Input | Output | Input | Output |
| 00000 | 000000 | 00000 | 000000 |
| 00001 | 000001 | 00001 | 000001 |
| 00010 | 000010 | 00010 | 000010 |
| 00011 | 000001 | 00011 | 000001 |
| 00100 | 000100 | 00100 | 000100 |
| 00101 | 000101 | 00101 | 000101 |
| 00110 | 000110 | 00110 | 000110 |
| 00111 | 100101 | 00111 | 100101 |
| 01000 | 001000 | 01000 | 001000 |
| 01001 | 001001 | 01001 | 001001 |
| 01010 | 001010 | 01010 | 001010 |
| 01011 | 100100 | 01011 | 100100 |
| 01100 | 001100 | 01100 | 001100 |
| 01110 | 001101 | 01110 | 001101 |
| 01111 | 100010 | 01111 | 100010 |
| 10000 | 100000 | 10000 | 100000 |
| 10001 | 010000 | 10001 | 010000 |
| 10010 | 010001 | 10010 | 010001 |
| 10011 | 010100 | 10011 | 010100 |
| 10100 | 010101 | 10100 | 010101 |
| 10101 | 010110 | 10101 | 010110 |
| 10110 | 101101 | 10110 | 101101 |
| 11000 | 011000 | 11000 | 011000 |
| 11001 | 011001 | 11001 | 011001 |
| 11010 | 011010 | 11010 | 011010 |
| 11011 | 101100 | 11011 | 101100 |
| 11100 | 101000 | 11100 | 101000 |
| 11101 | 101010 | 11101 | 101010 |
| 11110 | 110100 | 11110 | 110010 |
| 11111 | 110101 | 11111 | 110110 |

Table. 3 shows a rate-5/6 MTR (j=2) code. The rate-5/6 MTR j=2) code is converted using conversion tables divided into two states, and an encoding and decoding method is as follows: ① To allocate a code to each of 25 (32) possible input data, each of "STATE-0" and "STATE-1" includes 30 codes. 5-bit input data is encoded by selecting one of two conversion states. The last two codewords of "STATE-0" and "STATE-1" are different from each other, and state selection is determined according to whether the least significant bit of an encoded previous codeword is '0' or '1'. In other words, if the least significant bit of the previous codeword is '0', input data is converted to a codeword of "STATE-0", and if the least significant bit of the previous codeword is '1', input data is converted to a codeword of "STATE-1". ② When "STATE-1" is selected, if input data is '11110' or '11111', a least significant bit of a previous codeword is converted to '0' to satisfy a j=2 constraint condition. ③ If an encoded 6-bit output is '000000' and a most significant bit of a subsequent codeword is '0', the last two bits of a current codeword are converted to '1'. ④ If a least significant bit of a previous codeword is '0' and the first 5 bits of a current codeword are '0', the first 2 bits of the current codeword are converted to '1'. ⑤ If 7 or more consecutive 0s span between a last portion of a previous codeword and a first portion of a current codeword and the condition of the item ④ is not satisfied, the last two bits of the previous codeword are converted to '1'. Accordingly, the highest acceptable value of k in the code is 6. ⑥ When decoding is performed, if the last two bits of a codeword are '1', the bits are converted to '00', and if the first 5 bits of a codeword are '11000', the bits are converted to '00000'. Also, if the first 3 bits of a current codeword are '110' and the last 2 bits are '10', a least significant bit '0' of a previous codeword is converted to '1'. Likewise, after a conversion process corresponding to each condition is performed, an input corresponding to each codeword is decoded using the code table.

A rate-6/7 MTR code building method includes the following steps: ① Codewords including a '111' pattern among all codewords composed of 7 bits are removed. ② If a k-constraint condition is not considered, the number of valid codewords not including '11' at the first 2 bits or last 2 bits is 57. Therefore, to build codewords for 6-bit inputs, at least 7 ($2^6$–57) additional codewords are necessary. ③ To build 64 codewords, 9 codewords, each beginning with '110' and satisfying a j=2 MTR condition at the other 4 bits, that is, '1100000', '1100001', '1100010', '1100100', '1100101', '1100110', '1101000', '1101001', and '1101010', are considered. ④ When the 9 additional codewords are used, if a least significant bit of a previous codeword is '0', the MTR constraint condition is satisfied. However, if the least significant bit of the previous codeword is '1', to satisfy a j=2 condition, the last 3 bits of the previous codeword and the first 3 bits '110' of a current codeword are converted as follows:

... 001,110 ... ⇒ ... 011,001 ...
... 101,110 ... ⇒ ... 011,010 ...

⑤ So as not to generate a codeword where k=∞ among 66 available codewords, a codeword '0000000' is removed. Here, since the longest length of consecutively generated '0s' is '1000000,0000001', a maximum run-length is 12 bits. ⑥ To reduce the k-condition more, codewords are converted as follows:

... 000,000 ... ⇒ ... 011,000 ...

If the codewords are converted as shown above, since the longest length of consecutively generated '0s' is '1000000, 001 ...' or '... 100,0000001', k becomes 8. ⑦ A decoding process of an encoded code sequence is achieved by performing these steps in reverse order.

According to the code built according to the above method, the number of available codewords is 65. Accordingly, a rate-6/7 code table can be built by selecting 64 codewords out of the 65 codewords listed in Table 4, and the highest acceptable value of k in the code is 8.

TABLE 4

Rate-6/7 MTR (j = 2; k = 8) code table

| | | | |
|---|---|---|---|
| 0001000↵ | 0101000↵ | 1001000↵ | 1101000↵ |
| 0000001↵ | 0100001↵ | 1000001↵ | 1100001↵ |
| 0000010↵ | 0100010↵ | 1000010↵ | 1100010↵ |
| 0001001↵ | 0101001↵ | 1001001↵ | 1101001↵ |
| 0000100↵ | 0100100↵ | 1000100↵ | 1100100↵ |
| 0000101↵ | 0100101↵ | 1000101↵ | 1100101↵ |
| 0000110↵ | 0100110↵ | 1000110↵ | 1100110↵ |
| 0001010↵ | 0101010↵ | 1001010↵ | 1101010↵ |
| 0011000↵ | 0110001↵ | 1011000↵ | 0001100↵ |
| 0010001↵ | 0010000↵ | 1010001↵ | 0001101↵ |
| 0010010↵ | 0100000↵ | 1010010↵ | 0101100↵ |
| 0011001↵ | 0110000↵ | 1011001↵ | 0101101↵ |
| 0010100↵ | 1000000↵ | 1010100↵ | 1001100↵ |
| 0010101↵ | 1010000↵ | 1010101↵ | 1001101↵ |
| 0010110↵ | 1100000↵ | 1010110↵ | 0110100↵ |
| 0011010↵ | 0110010↵ | 1011010↵ | 0110101↵ |

SUMMARY OF THE INVENTION

The present invention provides a rate-7/8 MTR code encoding/decoding method and apparatus for limiting the number of data transitions to be 2 or less in each codeword and allowing the number of data transitions to be at most 3 at necessary boundaries when codewords are consecutively input, in order to achieve a relatively higher code rate than conventional MTR codes where the number of data transitions is 2 or less while improving detection performance compared to conventional general modulation codes.

According to an exemplary embodiment of the present invention, there is provided a rate-7/8 MTR code encoding method comprising: generating a rate-7/8 MTR code for inputting 7-bit data and outputting a predetermined 8-bit codeword; checking whether codewords satisfy a predetermined constraint condition by connecting the 8-bit codeword and a subsequent 8-bit codeword; and converting the codewords if the codewords violate the constraint condition and not converting the codewords if the codewords do not violate the constraint condition. The rate-7/8 MTR code comprises: 98 codewords remaining after excluding '00000000', '00000001', '00100000', '01000000', '01100000', '10000000', and '10100000' from 105 codewords each including no more than one '1' at the first two bits thereof and no more than one '1' at the last two bits thereof so that an MTR constraint condition (j=2) indicating allowable consecutive data transitions is satisfied when codewords are consecutively input, among 256 8-bit codewords; and 30 codewords obtained by excluding the codeword '11010000' and 13 codewords beginning with '1100' from 44 codewords beginning with '110' or ending with '011'.

The checking of whether the codewords satisfy the predetermined constraint condition comprises: when a codeword is connected to one of the 128 codewords and it is assumed that c(k) represents a current codeword to be checked to determine whether or not the constraint condition is violated and c(k+1) represents a subsequent codeword, determining whether the last 2 bits ($x_1$, $x_0$) of the current codeword and the first 4 bits ($y_7$, $y_6$, $y_5$, $y_4$) of the subsequent codeword violate the MTR constraint condition. The converting of the codewords comprises: when it is assumed that z0 indicates a parameter for determining whether the number of consecutive '0's is equal to or less than 7 and z1 indicates a parameter for determining whether codewords satisfy a constraint condition (j=3), calculating z0 and z1 using $z_0 = x_1 + x_0 + y_7 + y_6 + y_5 + y_4$, $z_1 = x_1 \cdot x_0 \cdot y_7 \cdot y_6 \cdot y_4$ (here, +indicates a modular-2 add operation); when $z_0 = 0$, converting $x_0$, $y_7$, and $y_6$ to 1 to satisfy k=7; and when $z_1 = 1$, converting $x_0$ and $y_4$ to 0 so that j does not exceed 3.

According to another exemplary embodiment of the present invention, there is provided a rate-7/8 MTR code encoding apparatus comprising: a 7/8 encoder generating a rate-7/8 MTR code for inputting 7-bit data and outputting a predetermined 8-bit codeword; and an MTR violation checking & converting unit checking whether codewords satisfy a predetermined constraint condition by connecting the 8-bit codeword and a subsequent 8-bit codeword, converting specific bits of the codewords if the codewords violate the constraint condition, and not converting the codewords if the codewords do not violate the constraint condition. The rate-7/8 MTR code comprises: 98 codewords remaining after excluding '00000000', '00000001', '00100000', '01000000', '01100000', '10000000', and '10100000' from 105 codewords each including no more than one '1' at the first two bits thereof and no more than one '1' at the last two bits thereof so that an MTR constraint condition (j=2) indicating allowable consecutive data transitions is satisfied when codewords are consecutively input, among 256 8-bit codewords; and 30 codewords obtained by excluding the codeword '11010000' and 13 codewords beginning with '1100' from 44 codewords beginning with '110'or ending with '011'.

When a codeword is connected to one of the 128 codewords and it is assumed that c(k) represents a current codeword to be checked to determine whether or not the constraint condition is violated and c(k+1) represents a subsequent codeword, checking of the MTR constraint condition in the MTR violation checking & converting unit is achieved by determining whether the last 2 bits ($x_1$, $x_0$) of the current codeword and the first 4 bits ($y_7$, $y_6$, $y_5$, $y_4$) of the subsequent codeword violate the MTR constraint condition, and when it is assumed that $z_0$ indicates a parameter for determining whether the number of consecutive '0's is equal to or less than 7 and $z_1$ indicates a parameter for determining whether codewords satisfy a constraint condition (j=3), the codeword conversion in the MTR violation checking & converting unit is achieved by calculating $z_0$ and $z_1$ using $z_0 = x_1 + x_0 + y_7 + y_6 + y_5 + y_4$, $z_1 = x_1 \cdot x_0 \cdot y_7 \cdot y_6 \cdot y_4$ (here, +indicates a modular-2 add operation), converting $x_0$, $y_7$, and $y_6$ to 1 to satisfy k=7 when $z_0 = 0$, and converting $x_0$ and $y_4$ to 0 so that j does not exceed 3 when $z_1 = 1$.

The rate-7/8 MTR code encoding apparatus can further comprise: a parallel-to-serial converter converting parallel codewords of the MTR violation checking & converting unit to serial data; and a precoder changing a signal level of the serial data in order to record the serial data in a channel.

According to another exemplary embodiment of the present invention, there is provided a rate-7/8 MTR code decoding method comprising: when it is assumed that c(k) represents a currently input 8-bit codeword and c(k+1) represents a subsequently input 8-bit codeword, checking whether the codewords satisfy a predetermined MTR constraint condition by connecting c(k) and c(k+1); if the codewords violate the MTR constraint condition, converting the codewords, and if the codewords do not violate the MTR constraint condition, not converting the codewords; and decoding each converted 8-bit codeword into 7-bit data using a predetermined MTR code. The rate-7/8 MTR code comprises: 98 codewords remaining after excluding '00000000', '00000001', '00100000', '01000000', '01100000', '10000000', and '10100000' from 105 codewords each including no more than one '1' at the first two bits thereof and no more than one '1' at the last two bits thereof so that an MTR constraint condition (j=2) indicating allowable consecutive data transitions is satisfied when codewords are consecutively input, among 256 8-bit codewords; and 30 codewords obtained by excluding the codeword '11010000' and 13 codewords beginning with '1100' from 44 codewords beginning with '110'or ending with '011'.

The checking of whether the codewords satisfy the predetermined MTR constraint condition comprises: when a codeword is connected to one of the 128 codewords and it is assumed that c(k) represents a current codeword to be checked to determine whether or not the constraint condition is violated and c(k+1) represents a subsequent codeword, determining whether the last 2 bits ($x_1$, $x_0$) of the current codeword and the first 4 bits ($y_7$, $y_6$, $y_5$, $y_4$) of the subsequent codeword violate the MTR constraint condition. The converting or not converting the codewords comprises: when it is assumed that $z_0$ indicates a parameter for determining whether the number of consecutive '0's is equal to or less than 7 and $z_1$ indicates a parameter for determining whether codewords satisfy a constraint condition (j=3), calculating $z_0$ and $z_1$ using $z_0 = x_0 \cdot y_7 \cdot y_6 \cdot \overline{y_4}$, $z_1 = x_1 \cdot y_7 \cdot y_6 \cdot \overline{y_4}$; when $z_0 = 0$, converting $x_0$, $y_7$, and $y_6$ to 0 to satisfy k=7; and when $z_1 = 1$, converting $x_0$ and $y_4$ to 1 so that j does not exceed 3.

The currently input codeword is equalized by an output of a reproducing channel, and the equalized result is decoded by input to a Viterbi decoder having a trellis obtained by combining a j=2 trellis and a j=3 trellis. The combined trellis is a modified j=3 trellis allowing 3 consecutive bits from a beginning bit of a boundary between connected codewords to satisfy a j=3 condition.

In the rate-7/8 MTR code decoding method, the fourth bit ($x_4$) through the LSB ($x_0$) of the current codeword are decoded using the j=2 trellis, and to apply the j=3 trellis to the first two bits $y_7$ and $y_6$ of the subsequent codeword, a trellis corresponding to $y_7$ is obtained by calculating the following additional branch metrics in the j=2 trellis $BM(\alpha_k = +1 | \alpha_{k-1} = -1, \alpha_{k-2} = +1, \alpha_{k-3} = -1, \alpha_{k-4} = -1)$ $BM(\alpha_k = -1 | \alpha_{k-1} = +1, \alpha_{k-2} = -1, \alpha_{k-3} = +1, \alpha_{k-4} = +1)$ a trellis corresponding to $y_6$ is obtained by calculating the following additional branch metrics in the j=2 trellis $BM(\alpha_k = +1 | \alpha_{k-1} = -1, \alpha_{k-2} = +1, \alpha_{k-3} = -1, \alpha_{k-4} = -1)$ $BM(\alpha_k = +1 | \alpha_{k-1} = +1, \alpha_{k-2} = -1, \alpha_{k-3} = +1, \alpha_{k-4} = -1)$ $BM(\alpha_k = -1 | \alpha_{k-1} = -1, \alpha_{k-2} = +1, \alpha_{k-3} = -1, \alpha_{k-4} = +1)$ $BM(\alpha_k = -1 | \alpha_{k-1} = +1, \alpha_{k-2} = -1, \alpha_{k-3} = +1, \alpha_{k-4} = +1)$ and a trellis corresponding to $y_5$ is obtained by calculating the following additional branch metrics in the j=2 trellis $BM(\alpha_k = +1 | \alpha_{k-1} = +1, \alpha_{k-2} = -1, \alpha_{k-3} = +1, \alpha_{k-4} = -1)$ $BM(\alpha_k = -1 | \alpha_{k-1} = -1, \alpha_{k-2} = +1, \alpha_{k-3} = -1, \alpha_{k-4} = +1)$ According to another aspect of the present invention, there is provided a rate-7/8 MTR code decoding apparatus comprising: an MTR violation checking & converting unit, when it is assumed that c(k) represents a currently input 8-bit codeword and c(k+1) represents a subsequently input 8-bit codeword, checking whether the codewords satisfy a predetermined MTR constraint condition by connecting c(k) and c(k+1), and if the codewords violate the MTR constraint condition, converting the codewords, and if the codewords do not violate the MTR constraint condition, not converting the codewords; and a 7/8 decoder decoding each 8-bit codeword output from the MTR violation checking & converting unit into 7-bit data using a predetermined MTR code. The rate-7/8 MTR code comprises: 98 codewords remaining after excluding '00000000', '00000001', '00100000', '01000000', '01100000', '10000000', and '10100000' from 105 codewords each including no more than one '1' at the first two bits thereof and no more than one '1' at the last two bits thereof so that an MTR constraint condition (j=2) indicating allowable consecutive data transitions is satisfied when codewords are consecutively input, among 256 8-bit codewords; and 30 codewords obtained by excluding the codeword '11010000' and 13 codewords beginning with '1100' from 44 codewords beginning with '110'or ending with '011'.

When a codeword is connected to one of the 128 codewords and it is assumed that c(k) represents a current codeword to be checked to determine whether or not the constraint condition is violated and c(k+1) represents a subsequent codeword, checking of the MTR constraint condition in the MTR violation checking & converting unit is achieved by determining whether the last 2 bits $(x_1, x_0)$ of c(k) and the first 4 bits $(y_7, y_6, y_5, y_4)$ of c(k+1) violate the MTR constraint condition. When it is assumed that $z_0$ indicates a parameter for determining whether the number of consecutive '0's is equal to or less than 7 and $z_1$ indicates a parameter for determining whether codewords satisfy a constraint condition (j=3), the codeword conversion in the MTR violation checking & converting unit is achieved by calculating $z_0$ and $z_1$ using $z_0 = x_0 \cdot y_7 \cdot y_6 \cdot \overline{y_4}$, $z_1 = x_1 \cdot y_7 \cdot y_6 \cdot \overline{y_4}$, converting $x_0$, $y_7$, and $y_6$ to 0 to satisfy k=7 when $z_0=0$, and converting $x_0$ and $y_4$ to 1 so that j does not exceed 3 when $z_1=1$.

The rate-7/8 MTR code decoding apparatus can further comprise: a fourth order partial response equalizer equalizing data received through a channel to compensate a reproducing characteristic of the channel with respect to a currently input 8-bit codeword and a subsequent 8-bit codeword; a Viterbi decoder including a trellis obtained by combining a j=2 trellis and a j=3 trellis, which is a modified j=3 trellis allowing consecutive 3 bits from a beginning bit of a boundary between connected codewords to satisfy a j=3 condition, and Viterbi decoding the equalized result using the combined trellis; and a serial-to-parallel converter converting serial data of the Viterbi decoder to parallel data.

According to another exemplary embodiment of the present invention, there is provided a computer readable medium having recorded thereon a computer readable program for performing a method described above.

BRIEF DESCRIPTION OF THE DRAWINGS

The above and other features and advantages of the present invention will become more apparent by describing in detail exemplary embodiments thereof with reference to the attached drawings in which:

FIG. 2 is a codeword table of a rate-7/8 MTR code according to an embodiment of the present invention;

DETAILED DESCRIPTION OF THE INVENTION

Hereinafter, the present invention will now be described more fully with reference to the accompanying drawings, in which embodiments of the invention are shown.

Figure 1:
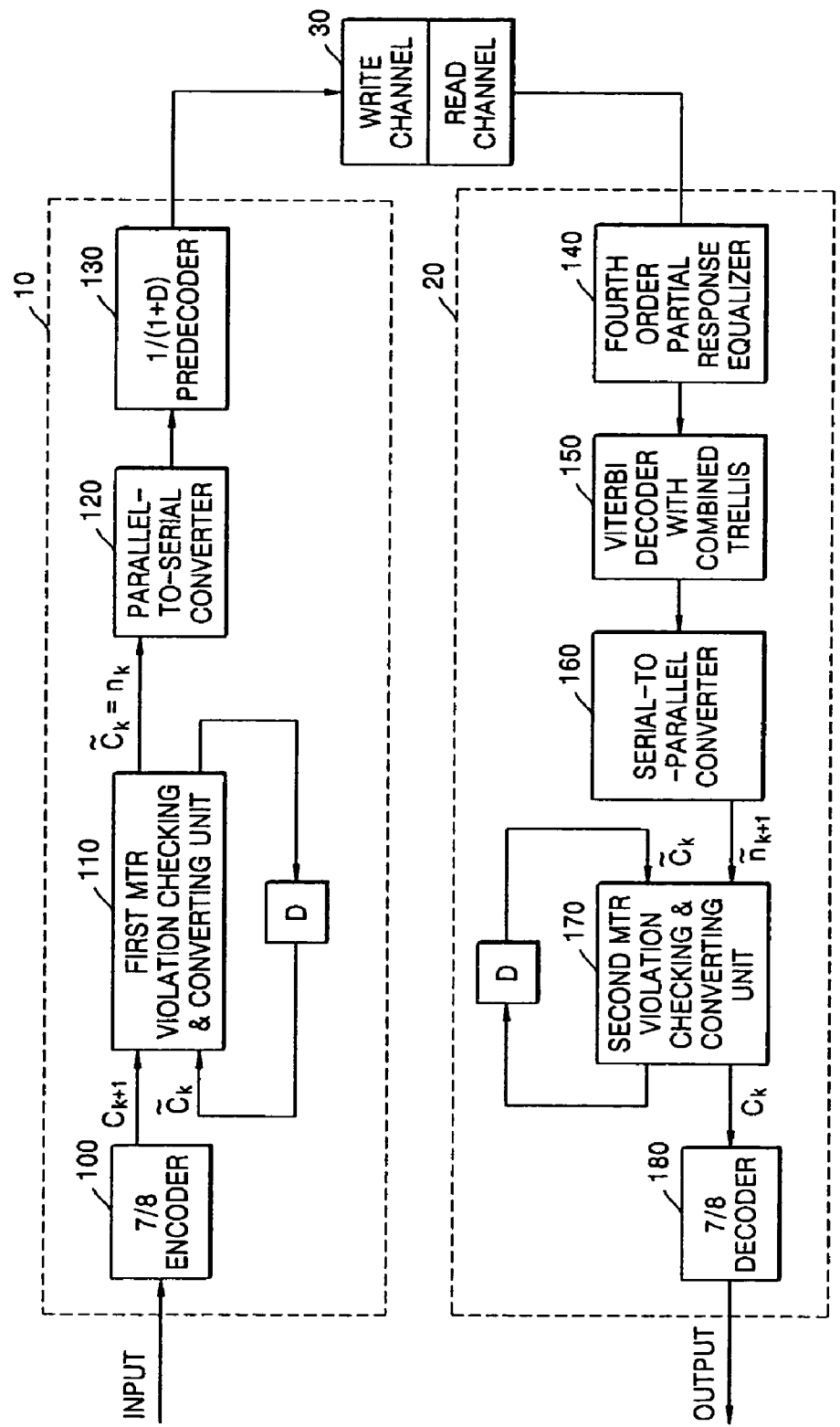
FIG. 1 is a block diagram of a rate-7/8 MTR encoding and decoding apparatus according to an embodiment of the present invention.

FIG. 1 is a block diagram of a rate-7/8 MTR encoding and decoding apparatus according to an embodiment of the present invention.

Referring to FIG. 1, a rate-7/8 MTR encoding apparatus 10 includes a 7/8 encoder 100, a first MTR violation checking & converting unit 110, a parallel-to-serial converter 120, and a precoder 130.

The 7/8 encoder 100 generates a rate 7/8 MTR code for outputting a predetermined 8-bit codeword from 7-bit data. The first MTR violation checking & converting unit 110 checks whether codewords satisfy a predetermined constraint condition by connecting the 8-bit codeword and a subsequent 8-bit codeword, converts specific bits of the codewords if the codewords violate the MTR constraint condition, and does not convert the codewords if the codewords do not violate the constraint condition.

The parallel-to-serial converter 120 converts parallel codewords of the first MTR violation checking & converting unit 110 to serial data. The precoder 130 changes a signal level of the serial data in order to record the serial data in a channel.

Also, a rate-7/8 MTR decoding apparatus 20 includes a fourth order partial response equalizer 140, a Viterbi decoder with combined trellis 150, a serial-to-parallel converter 160, a second MTR violation checking & converting unit 170, and a 7/8 decoder 180.

Assuming that a currently input 8-bit codeword is c(k) and a subsequently input 8-bit codeword is c(k+1), the second MTR violation checking & converting unit 170 checks whether the codewords satisfy a predetermined MTR constraint condition by connecting c(k) and c(k+1), converts the codewords if the codewords violate the MTR constraint condition, and does not convert the codewords if the codewords do not violate the MTR constraint condition. The 7/8 decoder 180 decodes each 8-bit codeword output from the second MTR violation checking & converting unit 170 into 7-bit data using a predetermined MTR code. The fourth order partial response equalizer 140 equalizes data received through the channel to compensate for the reproducing characteristic of the channel. The Viterbi decoder with combined trellis 150 includes a combined trellis and performs Viterbi decoding. The serial-to-parallel converter 160 converts serial data of the Viterbi decoder with combined trellis 150 to parallel data.

Operations of the rate-7/8 MTR encoding apparatus 10 and the rate-7/8 MTR decoding apparatus 20 will now be described. First, 7-bit user data is input to the 7/8 encoder 100 and an 8-bit codeword $C_{k+1}$ is output from the 7/8 encoder 100. In the first MTR violation checking & converting unit 110 is checked whether the output codeword $C_{k+1}$ and a previously changed codeword $\tilde{C}_k$ violate an MTR constraint condition, and if they violate the MTR constraint condition, specific bits of the codewords are converted, and the previously changed codeword $\tilde{C}_k = n_k$ is output. Here, the codeword $C_{k+1}$ input from the 7/8 encoder 100 and converted by the first MTR violation checking & converting unit 110 is input to a temporary memory to be checked whether the MTR constraint condition is violated along with a subsequent codeword. The output codeword $\tilde{C}_k = n_k$ is passed through the parallel-to-serial converter 120 and the precoder 130 and written in a magnetic write channel 30.

In a process of reproducing the recorded data, an output of a read channel 40 must be passed through an equalizer. Here, the fourth order partial response equalizer 140 is used as the equalizer, and the equalized output is input to the Viterbi decoder with combined trellis 150 having a combined trellis according to an embodiment of the present invention and undergoes a detection process. The detected data is input to the serial-to-parallel converter 160 and converted to an 8-bit codeword unit. The converted 8-bit codeword unit is input to the second MTR violation checking & converting unit 170 and a previous codeword ck is recovered. The previous codeword $c_k$ is decoded by the 7/8 decoder 180 and original data is output from the 7/8 decoder 180.

FIG. 2 is a codeword table of a rate-7/8 MTR code according to an embodiment of the present invention. A method of building a codeword table of a rate-7/8 MTR code will now be described.

When the length of a codeword is 8 bits and a k-constraint condition is not considered (k=∞), the number of valid codewords in which the maximum number of consecutive transitions (j) is equal to or less than 2 is 105. Each codeword includes at most one '1' in each of the first two bits and the last two bits so that a j=2 condition is satisfied when codewords are consecutively input. However, since 128 (=2$^7$) codewords are required to encode 7-bit input data into an 8-bit codeword, at least 23 additional codewords are needed. This can be solved by adding codewords beginning with "110" and codewords ending with "011." There exist 44 codewords beginning with "110" or ending with "011." Here, 13 codewords beginning with "1100" are excluded so that the number of consecutive transitions at a boundary is limited to equal to or less than 3 using the first MTR violation checking & converting unit 110. The number of remaining available codewords is 136(=105+(44−13)). To satisfy the k-constraint condition (k=7), 2 codewords beginning with 7 or 8 consecutive '0's, 5 codewords ending with 5 or more consecutive '0's, and a codeword violating the k-constraint condition (k=7) when the codeword is changed by the first MTR violation checking & converting unit 110, that is, '00000000', '00000001', '00100000', '01000000', '01100000', '10000000', '10100000', and '11010000', are additionally excluded from the 136 codewords. Therefore, a code according to an embodiment of the present invention is an MTR code having a code rate of 7/8, accepts that the maximum number of consecutive transitions is equal to or less than 2 in each codeword, and accepts that the maximum number of consecutive transitions is equal to or less than 3 in each boundary between codewords. However, if codewords corresponding to each input are simply found using the code table, the j=3 condition is not always satisfied in each boundary between codewords, and the k-constraint condition (k=7) may not be satisfied. Accordingly, a code, which can satisfy the conditions, is generated using the first MTR violation checking & converting unit 110.

Figure 3:
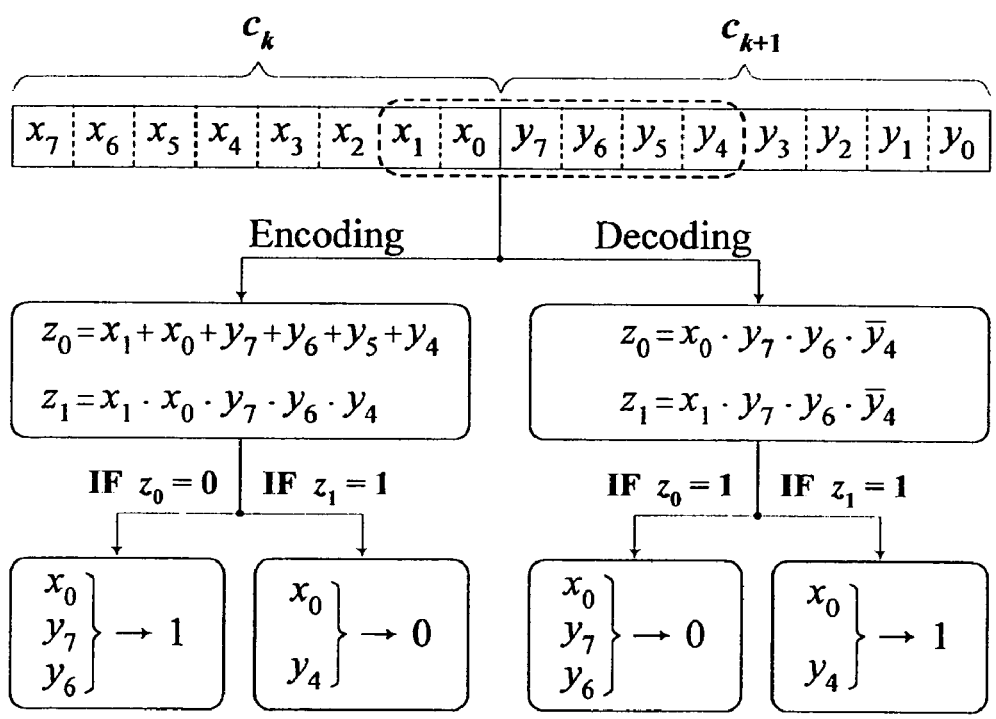
FIG. 3 illustrates an MTR condition violation check and conversion process for encoding and decoding.

FIG. 3 illustrates an MTR condition violation check and conversion process for encoding and decoding. Unlike a conventional rate 4/5, 5/6, or 6/7 MTR code, when a code rate is 7/8, since j=2 coding is impossible for entire codewords, in the embodiment of the present invention, j=3 can be accepted only in boundaries between codewords.

In an MTR violation check & conversion process for encoding, to satisfy the k-constraint condition (k=7) and allow up to j=3 in boundaries between codewords, specific codewords are converted as follows:

... 00,0000 ... ⇒ ... 01,1100 ...
... 11,1101 ... ⇒ ... 10,1100 ...

Here, since the k-constraint condition becomes 9 by converting " ... 11,11010000,0001 ... " to " ... 10,11000000,0001 ... ", use of the codeword '11010000' is excluded. When it is assumed that a current codeword is $c_k \in \{x_7(\text{MSB}), x_6, \ldots, x_0(\text{LSB})\}$ and a subsequent codeword is $c_{k+1} \in \{y_7(\text{MSB}), y_6, \ldots, y_0(\text{LSB})\}$, if the conversion process described above is performed, cases where $x_1$, $x_0$, and $y_7$ are simultaneously '1' and cases where $x_0$, $y_7$, and $y_6$ are simultaneously '1' are generated. Otherwise, all codewords satisfy the j=2 constraint condition. That is, with respect to the last two bits $(x_1, x_0)$ of a current codeword and the first four bits $(y_7, y_6, y_5, y_4)$ of a subsequent codeword, it is determined whether the MTR constraint condition is violated. Also, assuming that $z_0$ indicates a parameter for determining whether the number of consecutive '0's (k) is equal to or less than 7 and $z_1$ indicates a parameter for determining whether codewords satisfy the constraint condition (j=3), the codeword conversion in the first MTR violation checking & converting unit 110 is achieved by calculating $z_0$ and $z_1$ using $z_0 = x_1 + x_0 + y_7 + y_6 + y_5 + y_4$, $z_1 = x_1 \cdot x_0 \cdot y_7 \cdot y_6 \cdot y_4$ (here, + indicates a modular-2 add operation), converting $x_0$, $y_7$, and $y_6$ to 1 to satisfy k=7 when $z_0=0$, and converting $x_0$ and $y_4$ to 0 so that j does not exceed 3 when $z_1=1$.

The above steps are performed in reverse order in an MTR violation check & conversion process for decoding. That is, when a codeword is connected to one of the 128 codewords and it is assumed that c(k) represents a current codeword to be checked to determine whether or not the constraint condition is violated and c(k+1) represents a subsequent codeword, the checking of the MTR constraint condition in the second MTR violation checking & converting unit 170 is achieved by determining whether the last 2 bits $(x_1, x_0)$ of c(k) and the first 4 bits $(y_7, y_6, y_5, y_4)$ of c(k+1) violate the MTR constraint condition. Assuming that $z_0$ indicates a parameter for determining whether the number of consecutive '0's is equal to or less than 7 and $z_1$ indicates a parameter for determining whether codewords satisfy the constraint condition (j=3), the codeword conversion in the second MTR violation checking & converting unit 170 is achieved by calculating $z_0$ and $z_1$ using $z_0 = \overline{x_0} \cdot \overline{y_6} \cdot \overline{y_4}$, $z_1 = x_1 \cdot \overline{y_7} \cdot \overline{y_6} \cdot \overline{y_4}$, converting $x_0$, $y_7$, and $y_6$ to 0 to satisfy k=7 when $z_0=0$, and converting $x_0$ and $y_4$ to 1 so that j does not exceed 3 when $z_1=1$.

Figure 4:
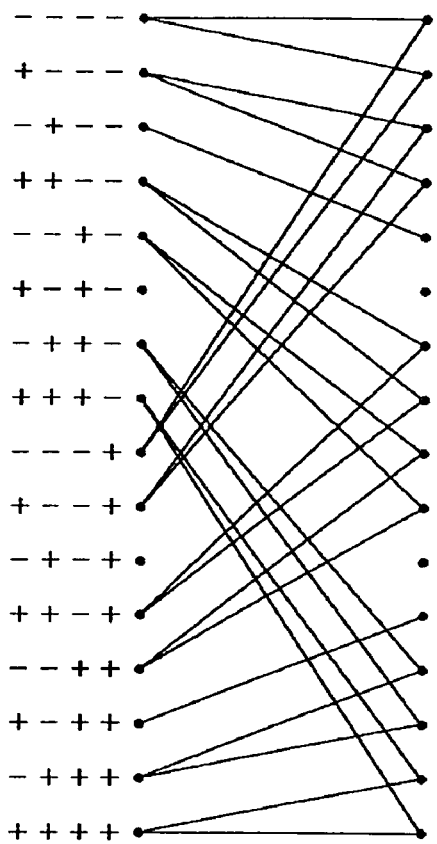
FIG. 4 shows trellis diagrams of a conventional MTR (j=2) code and a conventional MTR (j=3) code.
Figure 4:
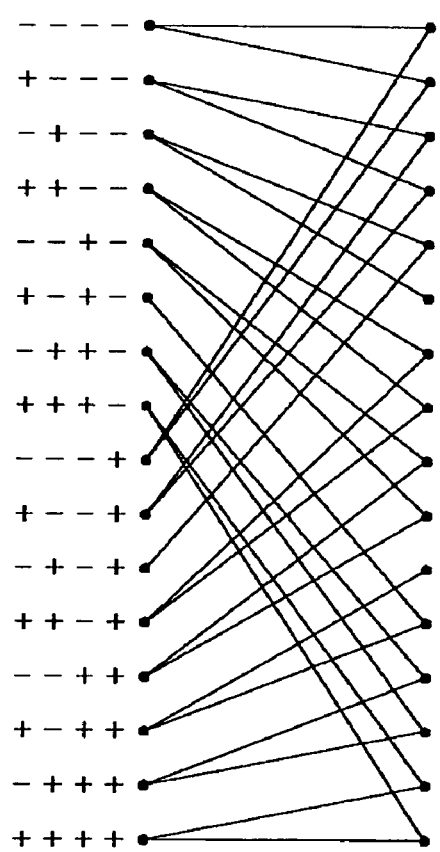

FIG. 4 shows trellis diagrams of a conventional MTR (j=2) code and a conventional MTR (j=3) code.

Referring to FIG. 4, in a conventional Viterbi detector for a fourth order partial response (PR) equalized MTR (j=2) code, 6 branches where 3 or more consecutive data transitions are generated are removed from a trellis diagram for obtaining branch metrics (BMs). As a result, in a high density magnetic recording channel, partial response most likelihood (PRML) detection performance for the MTR (j=2) code is dramatically improved compared to conventional PRML detection performance. However, the PRML detection performance for the MTR (j=2) code shows a relatively low code rate compared to an MTR (j=3) code.

On the other hand, in a fourth order PR equalized MTR (j=3) code, a code rate is improved. However, since only 2 branches where 4 or more consecutive data transitions are generated are removed in a Viterbi detector, PRML detection performance for the MTR (j=3) code is improved compared to conventional PRML detection performance but is inferior compared to the PRML detection performance for the MTR (j=2) code.

Figure 5:
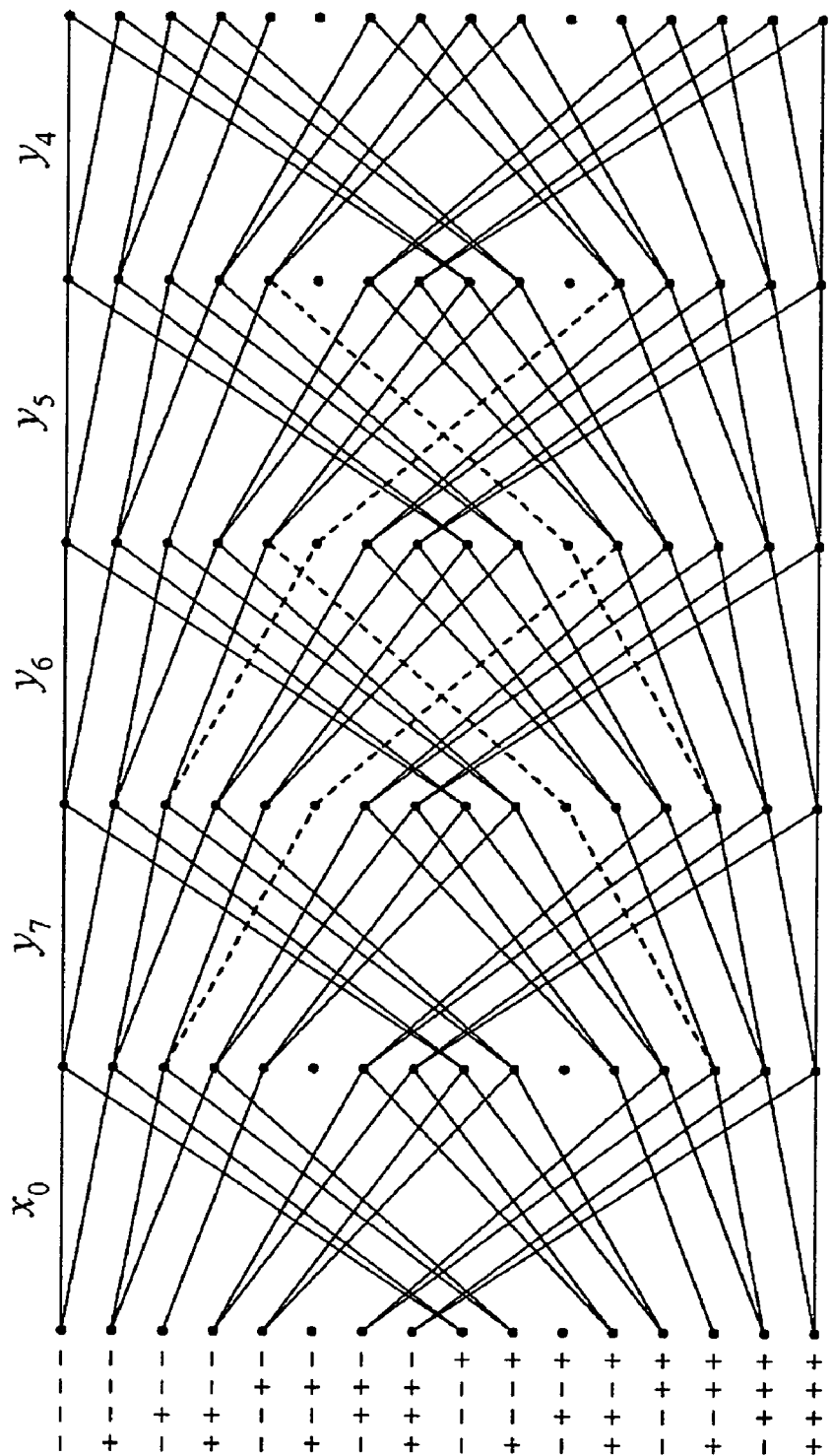
FIG. 5 is a trellis diagram of an MTR code where an MTR (j=2) code and an MTR (j=3) code are combined.

FIG. 5 is a trellis diagram of an MTR code where an MTR (j=2) code and an MTR (j=3) code are combined.

A PRML detecting method of an MTR coding technology according to an embodiment of the present invention can be realized by combining a j=2 trellis and a j=3 trellis. In this case, before a codeword boundary, a Viterbi detection technology using the j=2 trellis is applied to codeword conversion, and for 3 consecutive bits from the codeword boundary, a Viterbi detection technology using the j=3 trellis is applied to the codeword conversion in order to accept j=3 codewords. For example, bits from a fourth bit ($x_4$) to an LSB ($x_0$) of a current codeword can be detected using the j=2 trellis. However, since an MSB ($y_7$) and a subsequent bit ($y_6$) accept the j=3 constraint condition, it is necessary to change the trellis. Therefore, in a trellis corresponding to $y_7$, an additional BM must be calculated in a conventional j=2 trellis for the following cases:

$$BM(\alpha_k=+1|\alpha_{k-1}=-1, \alpha_{k-2}=+1, \alpha_{k-3}=-1, \alpha_{k-4}=-1)$$

$$BM(\alpha_k=-1|\alpha_{k-1}=+1, \alpha_{k-2}=-1, \alpha_{k-3}=+1, \alpha_{k-4}=+1)$$

Also, in a case of the subsequent bit ($y_6$), a BM of a conventional j=3 trellis is calculated due to the trellis corresponding to the previous bit ($y_7$). That is, an additional BM must be calculated in the conventional j=2 trellis for the following cases:

$$BM(\alpha_k=+1|\alpha_{k-1}=-1, \alpha_{k-2}=+1, \alpha_{k-3}=-1, \alpha_{k-4}=-1)$$

$$BM(\alpha_k=+1|\alpha_{k-1}=+1, \alpha_{k-2}=-1, \alpha_{k-3}=+1, \alpha_{k-4}=-1)$$

$$BM(\alpha_k=-1|\alpha_{k-1}=-1, \alpha_{k-2}=+1, \alpha_{k-3}=-1, \alpha_{k-4}=+1)$$

$$BM(\alpha_k=-1|\alpha_{k-1}=+1, \alpha_{k-2}=-1, \alpha_{k-3}=+1, \alpha_{k-4}=+1)$$

Finally, for bits after y6, since the j=2 constraint condition is applied to the bits, the trellis needs to be changed to allow only the j=2 constraint condition for a subsequent bit $y_5$. Therefore, in the trellis corresponding to $y_5$, an additional BM must be calculated in the conventional j=2 trellis for the following cases:

$$BM(\alpha_k=+1|\alpha_{k-1}=+1, \alpha_{k-2}=-1, \alpha_{k-3}=+1, \alpha_{k-4}=-1)$$

$$BM(\alpha_k=-1|\alpha_{k-1}=-1, \alpha_{k-2}=+1, \alpha_{k-3}=-1, \alpha_{k-4}=+1)$$

Figure 6:
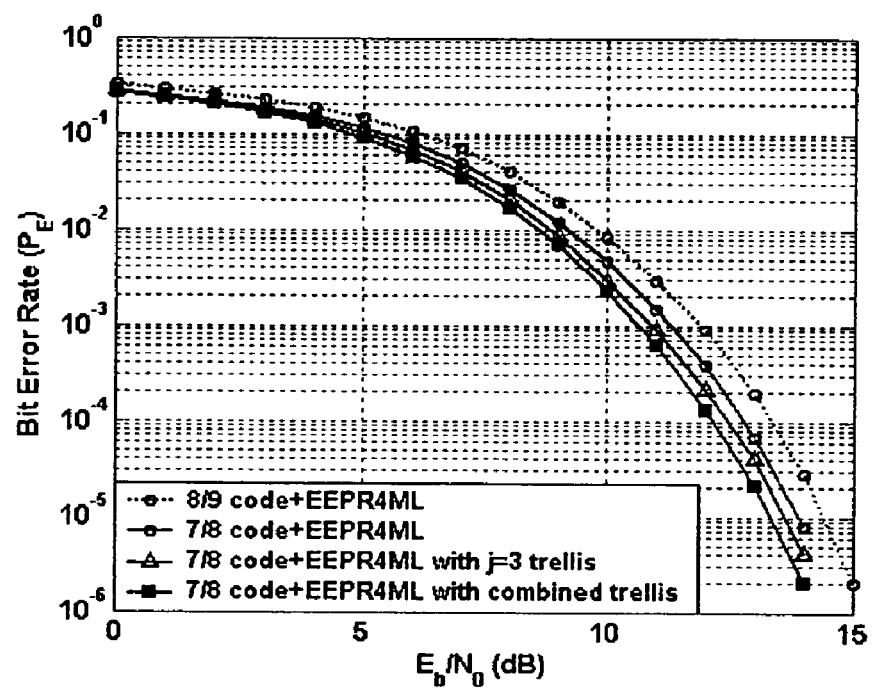
FIG. 6 is a graph used to compare BER performances in a linear horizontal magnetic write channel.

FIG. 6 is a graph used to compare BER performances in a linear horizontal magnetic write channel.

Referring to FIG. 6, the detection performance of a fourth order PRML detector having a rate 7/8 MTR code and a combined trellis according to an embodiment of the present invention and the detection performance of a rate 8/9 modulation code used for a conventional linear horizontal magnetic recording system are compared to each other. In a horizontal magnetic write channel used in this embodiment, a Lorentzian pulse where amplitude is normalized to 1 is used, and an EEPR4ML detector is used for a case where normalized density of a user bit is 2.5. As shown in FIG. 6, on the basis of a BER of $10^{-5}$ in high write density, the detection performance of the rate 8/9 code is deteriorated by more than 0.5 dB compared to the detection performance of the 7/8 code according to an embodiment of the present invention. That is, in a case of the 8/9 code, since consecutive transitions can be generated for up to 12 bits, interference between neighboring symbols becomes severe if write density becomes higher, thereby decreasing detection performance. When a conventional j=3 trellis is used for the 7/8 code, performance is improved by around 0.3 dB. Also, a Viterbi detector having a combined trellis according to an embodiment of the present invention can obtain a performance gain of more than 0.6 dB compared to a conventional EEPR4ML detector having the 7/8 code.

Figure 7:
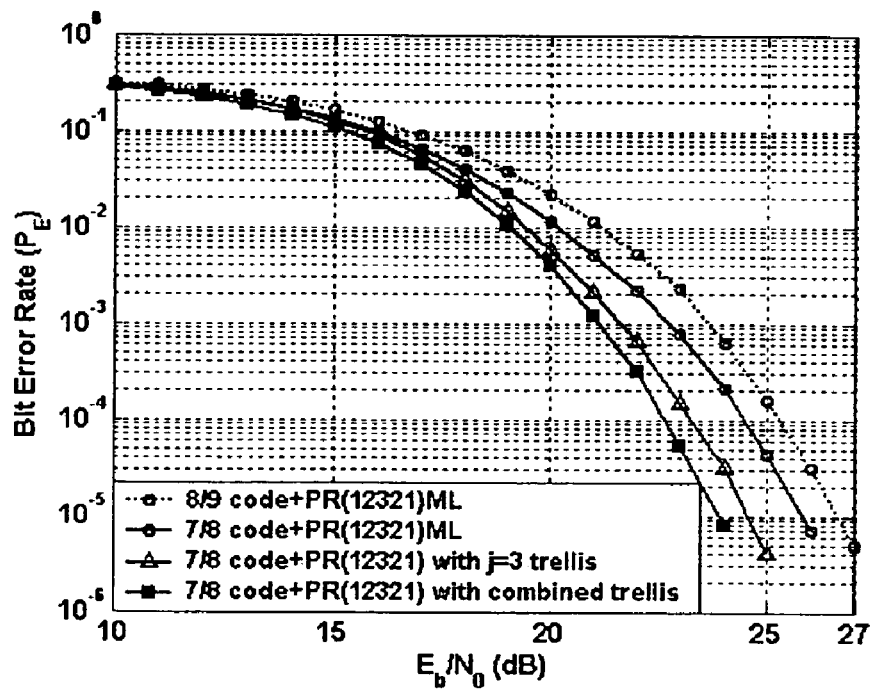
FIG. 7 is a graph used to compare BER performances in a linear vertical magnetic write channel.

FIG. 7 is a graph used to compare BER performances in a linear vertical magnetic write channel.

Referring to FIG. 7, the performance of a fourth order PRML detector having a rate 7/8 MTR code and a combined trellis according to an embodiment of the present invention and the detection performance of a rate 8/9 modulation code used for a conventional linear vertical magnetic recording system are compared to each other. In a vertical magnetic write channel used in this embodiment, a channel model disclosed in "Journal of Magnetism and Magnetic Materials/2001, P265–272" presented by H. Sawaguchi, Y. Nishida, H. Takano, and H. Aoi is used, and a PR(12321)ML detector is used for a case where normalized density of a user bit is 1.5. As shown in FIG. 7, on the basis of a BER of $10^{-5}$ in high write density, the detection performance of the rate 8/9 code is deteriorated by more than 0.8 dB compared to the performance of the 7/8 code according to an embodiment of the present invention. When a conventional j=3 trellis is used for the 7/8 code, performance is improved by around 1.3 dB. Also, a Viterbi detector having a combined trellis according to an embodiment of the present invention can obtain a performance gain of about 2 dB compared to a conventional PR(12321)ML detector having the 7/8 code.

Figure 8:
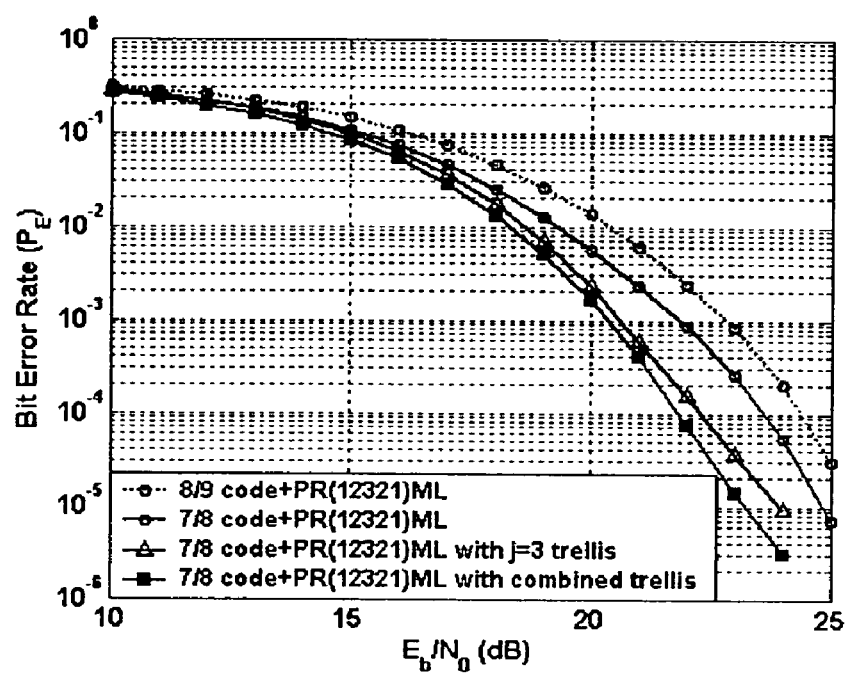
FIG. 8 is a graph used to compare BER performances in a non-linear horizontal magnetic write channel.

FIG. 8 is a graph used to compare BER performances in a non-linear horizontal magnetic write channel.

Referring to FIG. 8, the performance of a fourth order PRML detector having a rate 7/8 MTR code and a combined trellis according to an embodiment of the present invention and the detection performance of a rate 8/9 modulation code used for a conventional non-linear vertical magnetic recording system are compared to each other. In a non-linear vertical magnetic write channel used in this embodiment, a channel model including non-linear noise (for example, Jitter and DC-offset) is used, wherein a proportion of DC-offset noise is fixed to 10% of the entire noise and the proportions of Jitter noise and white Gaussian noise are fixed to 15% and 85% of the remaining noise, respectively, and a PR(12321)ML detector is used when normalized density of a user bit is 1.5. As shown in FIG. 8, on the basis of a BER of $10^{-5}$ in high write density, the detection performance of the rate 8/9 code is deteriorated by more than 0.8 dB compared to the performance of the 7/8 code according to an embodiment of the present invention. When a conventional j=3 trellis is used for the 7/8 code, performance is improved by around 0.8 dB. Also, a Viterbi detector having a combined trellis according to an embodiment of the present invention can obtain a performance gain of about 2 dB compared to a conventional PR(12321)ML detector having the 7/8 code.

As described above, according to embodiments of the present invention, since the number of data transitions is limited to 2 or less in each codeword and the maximum number of allowed data transitions is 3 at boundaries between codewords when the codewords are consecutive, detection performance is improved compared to conventional general modulation codes, and a relatively higher code rate than conventional MTR codes where the number of data transitions is 2 or less is achieved.

Also, since data can be reliably reproduced with high write density, a large amount of data can be stored in and reproduced from a magnetic recording information storage medium.

Also, since PRML detection with a combined trellis is performed to fit characteristics of a coding technology according to an embodiment of the present invention, detection performance is improved compared to a conventional PRML technology.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A rate-7/8 maximum transition run (MTR) code encoding method comprising:
    generating a rate-7/8 MTR code for inputting 7-bit data and outputting a predetermined 8-bit codeword;
    checking whether codewords satisfy a predetermined constraint condition by connecting the predetermined 8-bit codeword and a subsequent 8-bit codeword; and
    converting the codewords if the codewords violate the constraint condition and not converting the codewords if the codewords do not violate the constraint condition;
    wherein the rate-7/8 MTR code comprises:
    98 codewords remaining after excluding '00000000', '00000001', '00100000', '01000000', '01100000', '10000000', and '10100000' from 105 codewords each including no more than one '1' at the first two bits thereof and no more than one '1' at the last two bits thereof so that an MTR constraint condition (j=2) indicating allowable consecutive data transitions is satisfied when codewords are consecutively input, among 256 8-bit codewords; and
    codewords obtained by excluding the codeword '11010000' and 13 codewords beginning with '1100' from 44 codewords beginning with '110'or ending with '011'.

2. The method of claim 1, wherein the checking of whether the codewords satisfy the predetermined constraint condition comprises:
    when a codeword is connected to one of the 128 codewords and c(k) represents a current codeword to be checked to determine whether or not the constraint condition is violated and c(k+1) represents a subsequent codeword, determining whether the last 2 bits $(x_1, x_0)$ of the current codeword and the first 4 bits $(y_7, y_6, y_5, y_4)$ of the subsequent codeword violate the constraint condition, and
    the converting of the codewords comprises:
    when $z_0$ indicates a parameter for determining whether the number of consecutive '0's is equal to or less than 7 and $z_1$ indicates a parameter for determining whether codewords satisfy a constraint condition (j=3), calculating $z_0$ and $z_1$ using $z_0 = x_1 + x_0 + y_7 + y_6 + y_5 + y_4$, $z_1 = x_1 \cdot x_0 \cdot y_7 \cdot y_6 \cdot y_4$ (here, + indicates a modular-2 add operation);
    when $z_0=0$, converting $x_0$, $y_7$, and $y_6$ to 1 to satisfy k=7; and
    when $z_1=1$, converting $x_0$ and $y_4$ to 0 so that j does not exceed 3.

3. A rate-7/8 maximum transition run (MTR) code encoding apparatus comprising:
    a 7/8 encoder generating a rate-7/8 MTR code for inputting 7-bit data and outputting a predetermined 8-bit codeword; and
    an MTR violation checking and converting unit checking whether codewords satisfy a predetermined constraint condition by connecting the predetermined 8-bit codeword and a subsequent 8-bit codeword, converting specific bits of the codewords if the codewords violate the constraint condition, and not converting the codewords if the codewords do not violate the constraint condition;
    wherein the rate-7/8 MTR code comprises:
    98 codewords remaining after excluding '00000000', '00000001', '00100000', '01000000', '01100000', '10000000', and '10100000' from 105 codewords each including no more than one '1' at the first two bits thereof and no more than one '1' at the last two bits thereof so that an MTR constraint condition (j=2) indicating allowable consecutive data transitions is satisfied when codewords are consecutively input, among 256 8-bit codewords; and
    30 codewords obtained by excluding the codeword '11010000' and 13 codewords beginning with '1100' from 44 codewords beginning with '110'or ending with '011', and wherein
    when a codeword is connected to one of the 128 codewords and c(k) represents a current codeword to be checked to determine whether or not the constraint condition is violated and c(k+1) represents a subsequent codeword, checking of the MTR constraint condition in the MTR violation checking and converting unit is achieved by determining whether the last 2 bits $(x_1, x_0)$ of the current codeword and the first 4 bits $(y_7, y_6, y_5, y_4)$ of the subsequent codeword violate the MTR constraint condition; and
    when $z_0$ indicates a parameter for determining whether the number of consecutive '0's is equal to or less than 7 and $z_1$ indicates a parameter for determining whether codewords satisfy a constraint condition (j=3), the codeword conversion in the MTR violation checking and converting unit is achieved by calculating $z_0$ and $z_1$ using $z_0 = x_1 + x_0 + y_7 + y_6 + y_5 + y_4$, $z_1 = x_1 \cdot x_0 \cdot y_7 \cdot y_6 \cdot y_4$ (here, + indicates a modular-2 add operation), converting $x_0$, $y_7$, and $y_6$ to 1 to satisfy k=7 when $z_0=0$, and converting $x_0$ and $y_4$ to 0 so that j does not exceed 3 when $z_1=1$.

4. The apparatus of claim 3, further comprising:
    a parallel-to-serial converter converting parallel codewords of the MTR violation checking and converting unit to serial data; and
    a precoder changing a signal level of the serial data in order to record the serial data in a channel.

5. A rate-7/8 maximum transition run (MTR) code decoding method comprising:
    when c(k) represents a currently input 8-bit codeword and c(k+1) represents a subsequently input 8-bit codeword, checking whether the codewords satisfy a predetermined MTR constraint condition by connecting c(k) and c(k+1);
    if the codewords violate the MTR constraint condition, converting the codewords, and if the codewords do not violate the MTR constraint condition, not converting the codewords; and
    decoding each converted 8-bit codeword into 7-bit data using a predetermined MTR code;
    wherein the rate-7/8 MTR code comprises:
    98 codewords remaining after excluding '00000000', '00000001', '00100000', '01000000', '01100000', '10000000', and '10100000' from 105 codewords each including no more than one '1' at the first two bits thereof and no more than one '1' at the last two bits thereof so that an MTR constraint condition (j=2) indicating allowable consecutive data transitions is satisfied when codewords are consecutively input, among 256 8-bit codewords; and 30 codewords obtained by excluding the codeword '11010000' and 13 codewords beginning with '1100' from 44 codewords beginning with '110'or ending with '011'.

6. The method of claim 5, wherein the checking of whether the codewords satisfy the predetermined MTR constraint condition comprises:

when a codeword is connected to one of the 128 codewords and c(k) represents a current codeword to be checked to determine whether or not the constraint condition is violated and c(k+1) represents a subsequent codeword, determining whether the last 2 bits $(x_1, x_0)$ of the current codeword and the first 4 bits $(y_7, y_6, y_5, y_4)$ of the subsequent codeword violate the MTR constraint condition; and the converting or not converting the codewords comprises:

when $z_0$ indicates a parameter for determining whether the number of consecutive '0's is equal to or less than 7 and $z_1$ indicates a parameter for determining whether codewords satisfy a constraint condition (j=3), calculating $z_0$ and $z_1$ using $z_0 = x_0 \cdot y_7 \cdot y_6 \cdot \overline{y_4}$, $z_1 = x_1 \cdot y_7 \cdot y_6 \cdot \overline{y_4}$;

when $z_0=0$, converting $x_0$, $y_7$, and $y_6$ to 0 to satisfy k=7; and when $z_1=1$, converting $x_0$ and $y_4$ to 1 so that j does not exceed 3.

7. The method of claim 5, wherein the currently input codeword is equalized by an output of a reproducing channel, and an equalized result is decoded by inputting the equalized result to a Viterbi decoder having a trellis obtained by combining a j=2 trellis and a j=3 trellis, and the combined trellis is a modified j=3 trellis allowing 3 consecutive bits from a beginning bit of a boundary between connected codewords to satisfy a j=3 condition.

8. The method of claim 6, wherein the currently input codeword is equalized by an output of a reproducing channel, and an equalized result is decoded by inputting the equalized result to a Viterbi decoder having a trellis obtained by combining a j=2 trellis and a j=3 trellis, and the combined trellis is a modified j=3 trellis allowing 3 consecutive bits from a beginning bit of a boundary between connected codewords to satisfy a j=3 condition.

9. The method of claim 7, wherein the fourth bit $(x_4)$ through the LSB $(x_0)$ of the current codeword are decoded using the j=2 trellis, and to apply the j=3 trellis to the first two bits $y_7$ and $y_6$ of the subsequent codeword, a trellis corresponding to $y_7$ is obtained by calculating the following additional branch metrics in the j=2 trellis $BM(\alpha_k=+1|\alpha_{k-1}=-1, \alpha_{k-2}=+1, \alpha_{k-3}=-1, \alpha_{k-4}=-1)$ $BM(\alpha_k=+1|\alpha_{k-1}=+1, \alpha_{k-2}=-1, \alpha_{k-3}=+1, \alpha_{k-4}=+1)$ a trellis corresponding to $y_6$ is obtained by calculating the following additional branch metrics in the j=2 trellis $BM(\alpha_k=+1|\alpha_{k-1}=-1, \alpha_{k-2}=+1, \alpha_{k-3}=-1, \alpha_{k-4}=-1)$ $BM(\alpha_k=+1|\alpha_{k-1}=+1, \alpha_{k-2}=-1, \alpha_{k-3}=+1, \alpha_{k-4}=-1)$ $BM(\alpha_k=-1|\alpha_{k-1}=-1, \alpha_{k-2}=+1, \alpha_{k-3}=-1, \alpha_{k-4}=+1)$ $BM(\alpha_k=-1|\alpha_{k-1}=+1, \alpha_{k-2}=-1, \alpha_{k-3}=+1, \alpha_{k-4}=+1)$ and a trellis corresponding to $y_5$ is obtained by calculating the following additional branch metrics in the j=2 trellis $BM(\alpha_k=+1|\alpha_{k-1}=+1, \alpha_{k-2}=-1, \alpha_{k-3}=+1, \alpha_{k-4}=-1)$ $BM(\alpha_k=+1|\alpha_{k-1}=-1, \alpha_{k-2}=+1, \alpha_{k-3}=-1, \alpha_{k-4}=+1)$.

10. A rate-7/8 maximum transition run (MTR) code decoding apparatus comprising:

an MTR violation checking and converting unit, when c(k) represents a currently input 8-bit codeword and c(k+1) represents a subsequently input 8-bit codeword, checking whether the codewords satisfy a predetermined MTR constraint condition by connecting c(k) and c(k+1), and if the codewords violate the MTR constraint condition, converting the codewords, and if the codewords do not violate the MTR constraint condition, not converting the codewords; and a 7/8 decoder decoding each 8-bit codeword output from the MTR violation checking and converting unit into 7-bit data using a predetermined MTR code;

wherein the rate-7/8 MTR code comprises:

98 codewords remaining after excluding '00000000', '00000001', '00100000', '01000000', '01100000', '10000000', and '10100000' from 105 codewords each including no more than one '1' at the first two bits thereof and no more than one '1' at the last two bits thereof so that an MTR constraint condition (j=2) indicating allowable consecutive data transitions is satisfied when codewords are consecutively input, among 256 8-bit codewords; and 30 codewords obtained by excluding the codeword '11010000' and 13 codewords beginning with '1100' from 44 codewords beginning with '110'or ending with '011'.

11. The apparatus of claim 10, wherein, when a codeword is connected to one of the 128 codewords and c(k) represents a current codeword to be checked to determine whether or not the constraint condition is violated and c(k+1) represents a subsequent codeword, checking of the MTR constraint condition in the MTR violation checking and converting unit is achieved by determining whether the last 2 bits $(x_1, x_0)$ of c(k) and the first 4 bits $(y_7, y_6, y_5, y_4)$ of c(k+1) violate the MTR constraint condition, and when $z_0$ indicates a parameter for determining whether the number of consecutive '0's is equal to or less than 7 and $z_1$ indicates a parameter for determining whether codewords satisfy a constraint condition (j=3), the codeword conversion in the MTR violation checking and converting unit is achieved by calculating $z_0$ and $z_1$ using $z_0 = x_0 \cdot y_7 \cdot y_6 \cdot \overline{y_4}$, $z_1 = x_1 \cdot y_7 \cdot y_6 \cdot \overline{y_4}$, converting $x_0$, $y_7$, and $y_6$ to 0 to satisfy k=7 when $z_0=0$, and converting $x_0$ and $y_4$ to 1 so that j does not exceed 3 when $z_1=1$.

12. The apparatus of claim 10, further comprising:

a fourth order partial response equalizer equalizing data received through a channel to compensate a reproducing characteristic of the channel with respect to a currently input 8-bit codeword and a subsequent 8-bit codeword;

a Viterbi decoder including a trellis obtained by combining a j=2 trellis and a j=3 trellis, which is a modified j=3 trellis allowing consecutive 3 bits from a beginning bit of a boundary between connected codewords to satisfy a j=3 condition, and Viterbi decoding the equalized result using the combined trellis; and a serial-to-parallel converter converting serial data of the Viterbi decoder to parallel data.

13. The apparatus of claim 1 further comprising:

a fourth order partial response equalizer equalizing data received through a channel to compensate a reproducing characteristic of the channel with respect to a currently input 8-bit codeword and a subsequent 8-bit codeword;

a Viterbi decoder including a trellis obtained by combining a j=2 trellis and a j=3 trellis, which is a modified j=3 trellis allowing consecutive 3 bits from a beginning bit of a boundary between connected codewords to satisfy a j=3 condition, and Viterbi decoding the equalized result using the combined trellis; and a serial-to-parallel converter converting serial data of the Viterbi decoder to parallel data.

14. A computer readable medium having recorded thereon a computer readable program for performing a rate-7/8 maximum transition run (MTR) code encoding method comprising:

generating a rate-7/8 MTR code for inputting 7-bit data and outputting a predetermined 8-bit codeword;

checking whether codewords satisfy a predetermined constraint condition by connecting the predetermined 8-bit codeword and a subsequent 8-bit codeword; and converting the codewords if the codewords violate the constraint condition and not converting the codewords if the codewords do not violate the constraint condition;

wherein the rate-7/8 MTR code comprises:

98 codewords remaining after excluding '00000000', '00000001', '00100000', '01000000', '01100000', '10000000', and '10100000' from 105 codewords each including no more than one '1' at the first two bits thereof and no more than one '1' at the last two bits thereof so that an MTR constraint condition (j=2) indicating allowable consecutive data transitions is satisfied when codewords are consecutively input, among 256 8-bit codewords; and 30 codewords obtained by excluding the codeword '11010000' and 13 beginning with '1100' from 44 codewords beginning with '110'or '011'.

* * * * *